United States Patent
Mistry et al.

[11] Patent Number: 5,930,605
[45] Date of Patent: Jul. 27, 1999

[54] COMPACT SELF-ALIGNED BODY CONTACT SILICON-ON-INSULATOR TRANSISTORS

[75] Inventors: Kaizad Rumy Mistry, Acton; Jeffrey William Sleight, Marlboro, both of Mass.

[73] Assignee: Digital Equipment Corporation, Maynard, Mass.

[21] Appl. No.: 08/895,328

[22] Filed: Jul. 16, 1997

Related U.S. Application Data

[62] Division of application No. 08/650,561, May 20, 1996, Pat. No. 5,821,575.

[51] Int. Cl.$^6$ .................. H01L 27/095; H01L 29/812
[52] U.S. Cl. ..................... 438/149; 438/167; 438/570
[58] Field of Search .................. 257/476, 350; 438/179, 178, 92, 167, 149, 169, 534, 570, 173

[56] References Cited

U.S. PATENT DOCUMENTS

| | | | |
|---|---|---|---|
| 4,053,916 | 10/1977 | Cricchi et al. | 257/353 |
| 4,254,428 | 3/1981 | Feth et al. | 257/476 |
| 4,771,323 | 9/1988 | Sasaki | 257/69 |
| 4,801,983 | 1/1989 | Ueno et al. | 257/390 |
| 4,809,056 | 2/1989 | Shirato et al. | 257/347 |
| 4,823,172 | 4/1989 | Mihara | 257/144 |
| 4,871,686 | 10/1989 | Davies | 257/577 |
| 4,899,202 | 2/1990 | Blake et al. | 257/336 |
| 4,965,643 | 10/1990 | Freeman | 257/476 |
| 5,014,108 | 5/1991 | O'Mara, Jr. et al. | 257/506 |
| 5,109,256 | 4/1992 | De Long | 257/476 |
| 5,160,989 | 11/1992 | Houston | 257/347 |
| 5,293,052 | 3/1994 | Cherne et al. | 257/349 |
| 5,317,181 | 5/1994 | Tyson | 257/347 |
| 5,320,971 | 6/1994 | Eklund et al. | 438/328 |
| 5,424,225 | 6/1995 | Yamaguchi et al. | 438/165 |
| 5,591,650 | 1/1997 | Hsu et al. | 438/154 |
| 5,629,544 | 5/1997 | Voldman et al. | 257/355 |
| 5,729,039 | 3/1998 | Beyer et al. | 257/347 |
| 5,804,858 | 8/1998 | Hsu et al. | 257/347 |
| 5,821,575 | 10/1998 | Mistry et al. | 257/281 |

*Primary Examiner*—Olik Chaudhuri
*Assistant Examiner*—William David Coleman
*Attorney, Agent, or Firm*—Sharp, Comfort & Merrett, P.C.

[57] ABSTRACT

A field effect transistor structure having: a first type conductivity semiconductor body disposed on an insulator and having formed in different regions thereof: (a) a source region; (b) a drain region, such source and drain regions being of a conductivity type opposite the conductivity type of the body; (c) a gate electrode adapted to control a flow of carriers in a channel through the semiconductor body between the source and drain regions; and (d) a Schottky contact region providing a Schottky diode between the semiconductor body and one of the source and drain regions. With such an arrangement, the Schottky diode, when forward biased provides a fixed voltage, about 0.3 V, between the semiconductor body and one of the source and drain regions. A method for forming a semiconductor structure, comprising the steps of: providing a semiconductor body over an electrical insulator; providing source and drain areas in the semiconductor body on either side of a gate channel; introducing dopant into un-masked portions of the source and drain areas to form source and drain regions in the semiconductor body, such mask blocking such dopant from passing into the masked portion of at least one of the source and drain areas and the contiguous portion of the semiconductor body; and forming a metal between the masked portion of the at least one of the source and drain regions and the contiguous portion of the semiconductor body. The metal forming step may be performed prior to, or subsequent to, the dopant introduction step.

17 Claims, 11 Drawing Sheets

COMPACT SELF-ALIGNED BODY CONTACT SILICON-ON-INSULATOR TRANSISTORS

This is a divisional of application Ser. No. 08/650,561 filed on May 20, 1996 now U.S. Pat. No. 5,821,575.

BACKGROUND OF THE INVENTION

This invention relates generally to semiconductor device structures and more particularly semiconductor device structures wherein transistor devices are formed in a semiconductor body disposed on an insulating substrate.

As is known in the art, transistors, such as metal oxide silicon (MOS) transistors, have been formed in isolated regions of a semiconductor body, such as in an epitaxial layer which was itself formed on a semiconductor, typically bulk silicon, substrate. With an n-channel MOS field effect transistor (FET), the body is of p-type conductivity and the source and drain regions are formed in the p-type conductivity body as N+type conductivity regions. With a p-channel MOSFET, the body, or epitaxial layer, is of n-type conductivity and the source and drain regions are formed in the n-type conductivity body as P+type conductivity regions.

It has been suggested that the semiconductor body, or layer, be formed on an insulating substrate, or over an insulating layer formed in a semiconductor substrate. Such technology is sometimes referred to as Silicon-on Insulator (SOI) technology. Silicon-on Insulator MOS technologies have a number of advantages over bulk silicon MOS transistors as described on "Silicon-on-Insulator Technology: Materials to VLSI" by Jean-Pierre Colinge, published by Kluwer Academic Publisher, 1991 at pages 1–5. These advantages include: reduced source/drain capacitance and hence improved speed performance and higher operating frequency; reduced N+ to P+ spacing and hence higher packing density; and higher "soft error" upset immunity (i.e., the immunity to the effects of alpha particles strikes). These advantages make SOI MOS technologies an attractive alternative to bulk MOS in the deep-sub-micrometer geometry regime.

One disadvantage of SOI transistors is the lack of a bulk silicon or body contact to the MOS transistor. That is, it is desirable to connect the p-type conductivity body, in the case of an n-channel MOSFET, or the n-type conductivity body, in the case of a p-channel MOSFET, to a fixed potential. This prevents various hysteresis effects associated with having the body potential "float" relative to ground. With bulk silicon MOSFETs such is relatively easy because the bottom of the bulk silicon can be easily electrically connected to the fixed potential. With an SOI transistor, however, the body is electrically isolated from the bottom of the substrate. Thus, SOI transistors without body contacts for coupling to ground are compact; however, they can suffer from the so-called "kink" effect or from parasitic lateral bipolar action. Both these effects can prevent proper circuit operation.

More particularly, the "kink" effect originates from impact ionization, and has been described in the above referenced publication at page 189. When an SOI MOSFET is operated at a relatively large drain-to-source voltage, channel electrons with sufficient energy cause impact ionization near the drain end of the channel. The generated holes build up in the body of the device, thereby raising the body potential. The increased body potential reduces the threshold voltage of the MOSFET. This increases the MOSFET current and causes the so-called "kink" in SOI MOSFET current vs. voltage (I–V) curves.

With regard to the lateral bipolar action, if the impact ionization results in a large number of holes, the body bias may be raised sufficiently so that the source region to body p-n junction is forward biased. The resulting emission of minority carriers into the body causes a parasitic npn bipolar transistor between source, body and drain to turn on, leading to loss of gate control over the MOSFET current.

Both the "kink" effect and parasitic bipolar effects can be avoided if charge is not allowed to accumulate in the body. An electrical bulk, or body, contact can be used to extract the charge. Because the hole charge in the body will move to lower potential regions, the body contact and the source terminals are typically tied together to eliminate the "floating body" effect. Several body contact schemes have been proposed for SOI MOSFET's, but these generally add to the size of MOSFET and neutralize the packing density benefits of SOI. FIGS. 1A–1D illustrate four methods encountered in the prior art for forming body contacts. FIG. 1A shows a conventional SOI n-MOSFET device 10a without a body contact. Any hole charge in the body cannot easily be removed. FIG. 1B shows an MOSFET device 10b with a body contact 12 at one end of the gate. A p+ diffusion is in contact with the p-type body under the gate. Hole charge in the body flows to the end of the device 10b and is collected by the body contact 12. If the device width is large, this structure may not prevent the "kink" effect since the resistance of the channel region typically is large, and holes may not be able to reach the end of the device with the body contact 12. Another disadvantage of this structure is the additional area required for the formation of the body contact 12. FIG. 1C shows another type of body contact, commonly called the H-gate structure. This structure solves the problem of collecting the charge from the body of wide MOSFET's. Here, a body contact 16 is provided at each end of the channel of n-MOSFET device 10c, allowing devices of larger widths. However, note that this structure requires significantly more area than the simple MOSFET of FIG. 1A. FIG. 1D shows a body contact 18 that is compact compared to that shown in FIGS. 1B and 1C. In this n-MOSFET device 10d, part of the source junction is doped p-type. This p-type region is shorted to the source and serves as a body contact since it is in contact with the body under the channel. Note however that in this case, the source/drain symmetry of the MOSFET 10d has been lost. As is also known, the source and drain terminals of MOSFET's are often required to be switched during operation, such as in "pass" transistors. Therefore, this mode of operation is not possible with the device 10d because the source and drain are not structurally symmetric.

Thus, prior art body contact schemes shown in FIGS. 1B–1D fall into two categories: either they consume additional area, as in FIGS. 1B–1C, or they do not allow source and drain to be interchanged, as in FIG. 1D.

SUMMARY OF THE INVENTION

In accordance with the present invention, a field effect transistor structure is provided, comprising: a first type conductivity semiconductor body disposed on an insulator and having formed in different regions thereof: (a) a source region; (b) a drain region, such source and drain regions being of a conductivity type opposite the conductivity type of the body; (c) a gate electrode adapted to control a flow of carriers in a channel in the semiconductor body between the source and drain regions; and (d) a Schottky contact region providing a Schottky diode between the semiconductor body and one of the source and drain regions.

With such an arrangement, the Schottky diode, when forward biased provides a fixed voltage, about 0.3 V, between the semiconductor body and one of the source and drain regions. Thus, when the Schottky diode is between the semiconductor body and the source region, when the source region is grounded, the semiconductor body is at a fixed potential, i.e., 0.3 volts, above ground. This Schottky diode is in parallel with the p-n junction diode between the source region and the body. As hole charge builds up in the body, the Schottky diode turns on when the body potential exceeds 0.3 V, and the charge is thereby emptied. Because the Schottky diode limits the semiconductor body potential to 0.3 V relative to ground, any change in FET threshold voltage is small and the "kink" effect is avoided. Further, the source region to semiconductor body p-n junction is not allowed to turn on, since the Schottky diode has a smaller turn-on voltage, i.e., about half that of a silicon p-n junction diode. In addition, a Schottky junction diode is a majority carrier device. Therefore, no minority carriers are injected into the silicon body when the Schottky diode is forward biased, at least for low to moderate current levels, and lateral bipolar action is avoided.

In accordance with another feature of the invention, a field effect transistor structure is provided, comprising: a first type conductivity semiconductor body having formed in different regions thereof: (a) a source region; (b) a drain region, such source and drain regions being of a conductivity type opposite the conductivity type of the body; (c) a gate electrode adapted to control a flow of carriers through a gate channel in the semiconductor body between the source and drain regions; (d) a Schottky contact region providing a Schottky diode between the semiconductor body and the source region; and (e) a Schottky contact region providing a Schottky diode between the semiconductor body and the drain region.

With such an arrangement, either the source or drain regions may be coupled to ground thereby enabling the transistor to operate as a "pass" transistor with the Schottky diode also having the advantages discussed above.

In accordance with another feature of the invention, a method is provided for forming a semiconductor structure, comprising the steps of: providing a semiconductor body over an electrical insulator; providing source and drain areas in the semiconductor body on either side of a gate channel; introducing dopant into un-masked portions of the source and drain areas to form source and drain regions in the semiconductor body, such mask blocking such dopant from passing into the masked portion of at least one of the source and drain areas and the contiguous portion of the semiconductor body; and forming a metal between the masked portion of the at least one of the source and drain regions and the contiguous portion of the semiconductor body to form a Schottky diode between the one of the source and drain regions and the semiconductor body. The metal forming step may be performed prior to, or subsequent to, the introduction of the dopant.

With such method, merely modifying the mask used to provide heavily doped source and drain regions in the lightly doped semiconductor body to thereby mask a portion of one of at least one of the source and drain areas and the contiguous portion of the semiconductor body enables easy formation of a Schottky diode between the at least one of the source and drain regions and the semiconductor body thereby providing a field effect transistor with the advantages discussed above. Further, the structure is formed which is also self-aligned along the device width (through not along the device length), as mis-alignment in the width direction will not impact the device performance. Preferably the semiconductor body is silicon and the metal is preferably a refractory metal silicide cladding in direct contact with the silicon body to form the Schottky diode.

BRIEF DESCRIPTION OF THE DRAWING

Other features and advantages of the invention will become more readily apparent with reference to the following detailed description taken together with the following drawings.

DESCRIPTION OF THE PREFERRED EMBODIMENTS

Figure 1A:
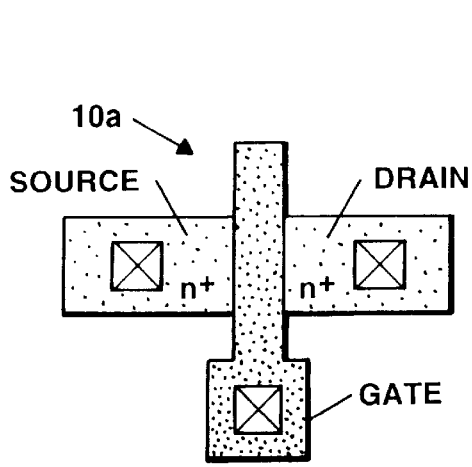
FIGS. 1A–1D are n-MOSFET devices according to the PRIOR ART.

Referring now to FIGS. 2 and 2A through 2C, a semiconductor structure, here an n-MOSFET 20 is shown. The MOSFET 20 structure includes an electrical insulator 22, here a silicon dioxide layer, formed in a semiconductor substrate 24. Here, the semiconductor substrate 24 is lightly doped p-type conductivity silicon. Thus, a lightly doped p-type conductivity, semiconductor body 26, is disposed on the insulator 22. The semiconductor body 26 has formed therein: (i) a heavily doped, N+ type conductivity source region 28; (ii) a heavily doped, N+ type conductivity drain region 30; (iii) a gate electrode 32 adapted to control a flow of carriers through a gate channel 34 the semiconductor body 26 between the source and drain regions 28, 30; and (d) a Schottky contact region 35, here a silicide region, providing a Schottky diode between the semiconductor body 26 and the source region 28. Here, the MOS 20 structure has a mesa-like isolation. Other forms of isolation, such as local oxidation (LOCOS) may be used. (It is noted that the source and drain regions 28, 30 are spaced from the insulator 22 at a distance d, where d may be zero). A schematic diagram of device 20 is shown in FIG. 3. Thus, a Schottky diode SC is formed with the cathode thereof connected to the source 28 and the anode thereof connected to body 26. With such an arrangement, the Schottky diode, SC, when forward biased provides a fixed voltage, about 0.3 V, between the semiconductor body 26 and the source region 28. Thus, when the source region 28 is grounded, the semiconductor body 26 body is at a fixed potential, i.e., 0.3 volts, above ground. Further, because the Schottky diode, SC, limits the silicon body 26 potential to 0.3 V relative to ground, any change in MOSFET 20 threshold voltage is small, and the "kink" effect is avoided.

Further, the source region 28 to semiconductor body 26 p-n junction is not allowed to turn on, since the Schottky diode has a smaller turn-on voltage, i.e., about half that of a silicon p-n junction diode. Also, since the Schottky diode is a majority carrier device, lateral bipolar action is avoided. Thus, no minority carriers are injected into the silicon body 26 when the Schottky diode, SC, is forward biased, at least for low to moderate current levels. This Schottky diode, SC, is in parallel with the p-n junction diode between the source region and silicon body 26. As hole charge builds up in the silicon body 26, the Schottky diode, SC, turns on when the silicon body 26 potential exceeds 0.3 V, and the charge is emptied.

Figure 2:
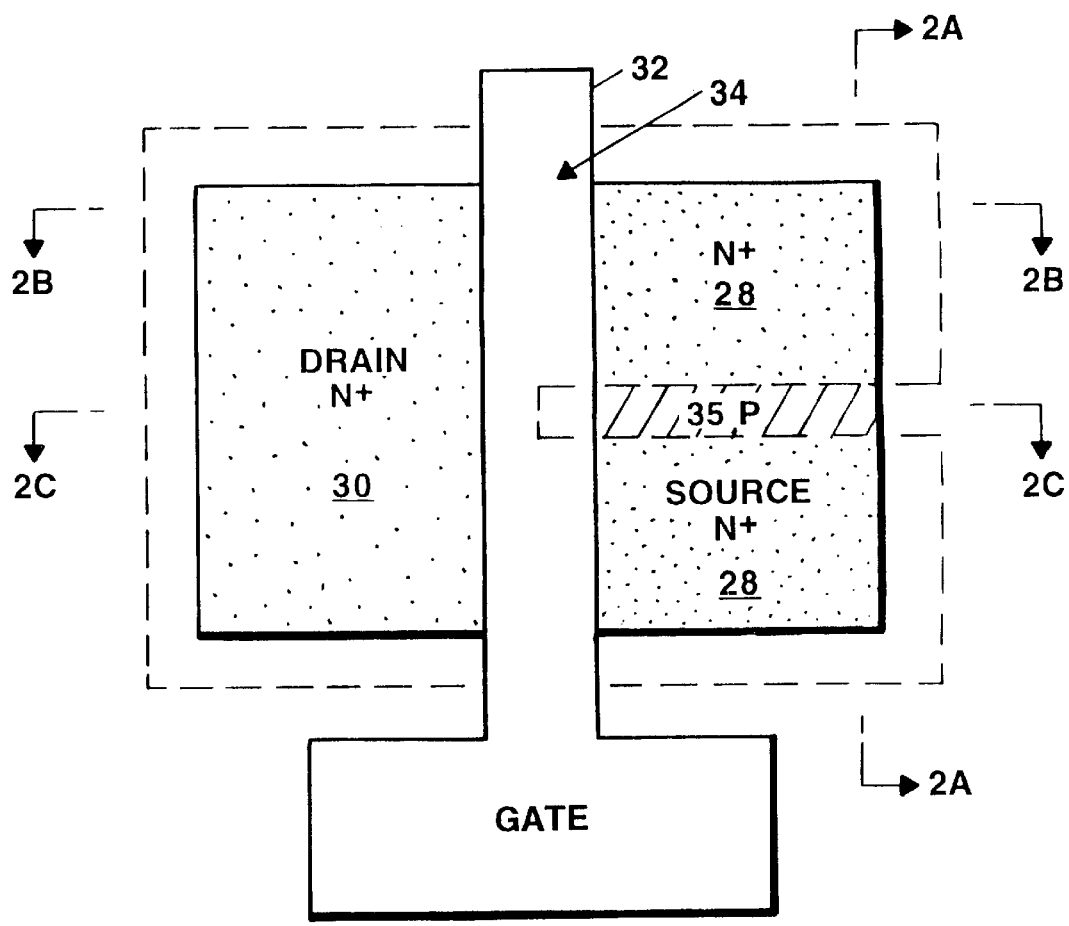
FIG. 2 is a plan view diagrammatical sketch of a field effect transistor structure according to the present invention.
Figure 2A:
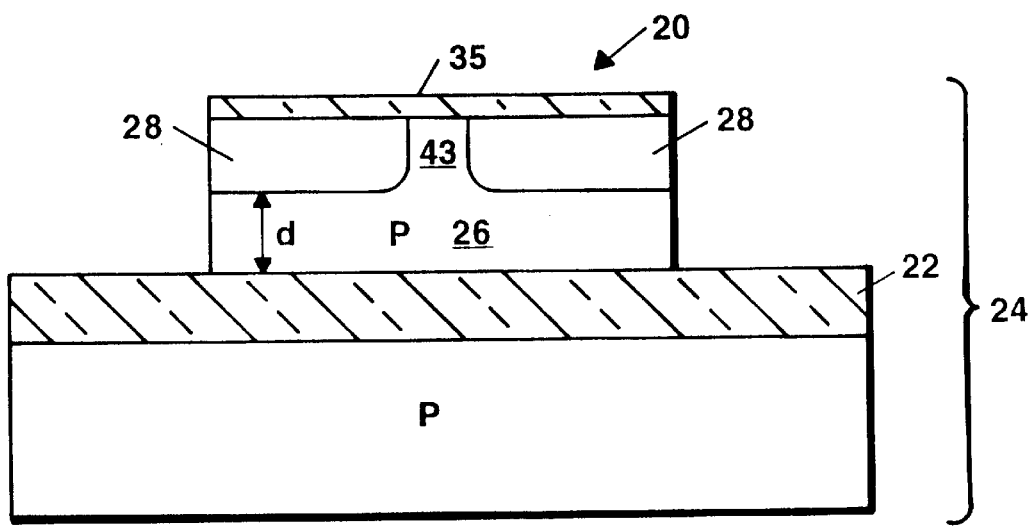
FIGS. 2A, 2B, and 2C are cross-sectional elevation diagrammatical sketches of the field effect transistor of FIG. 2, such cross-section being taken along line 2A—2A, 2B—2B, and 2C—2C, respectively, of FIG. 2.
Figure 2B:
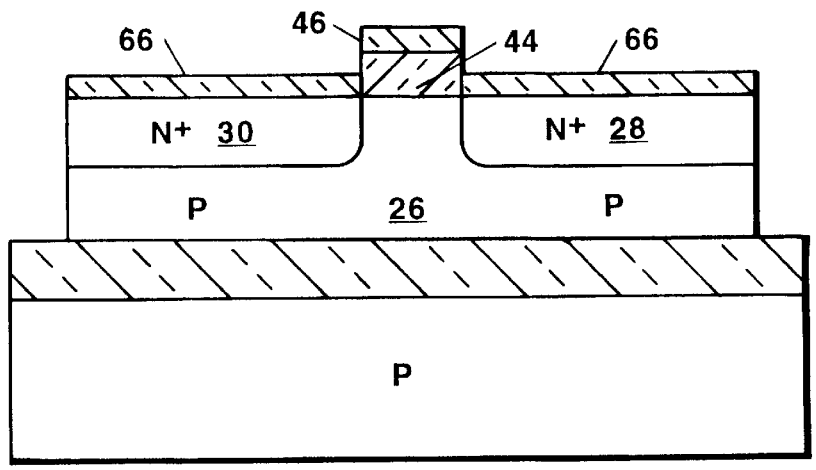
Figure 2C:
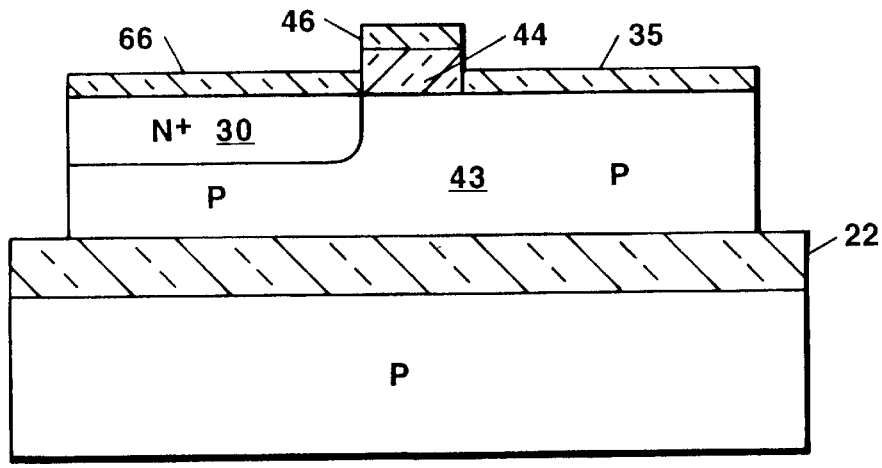
Figure 3:
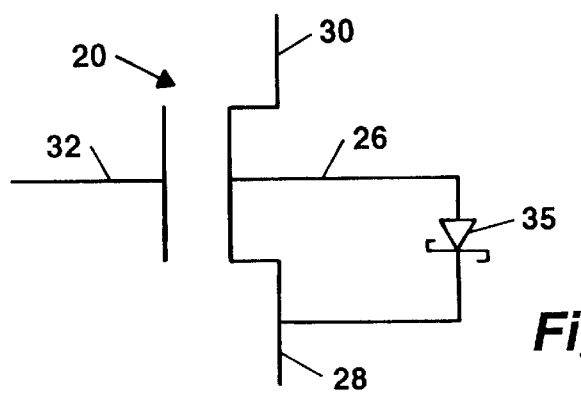
FIG. 3 is a schematic diagram of the field effect transistor of FIG. 2.
Figure 4:
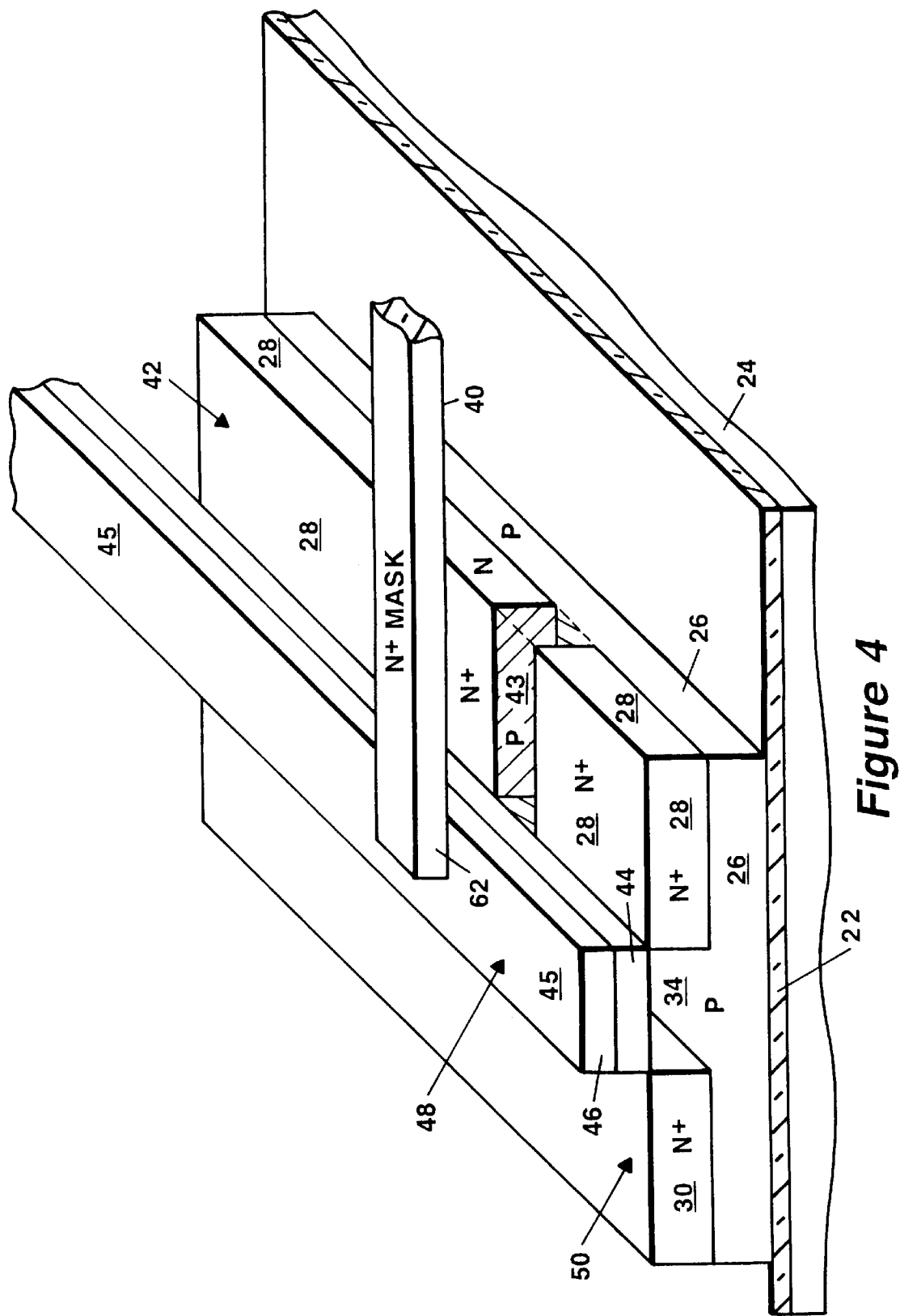
FIGS. 4 and 5 are perspective diagrammatical sketches of a field effect transistor structure of FIG. 2 at two stages in the fabrication of such transistor in accordance with the present invention and FIG. 4A is a plan view diagrammatical sketch illustrating a mask used in one step of the fabrication of the field effect transistor of FIG. 2, such mask also being shown in FIG. 4.
Figure 5:
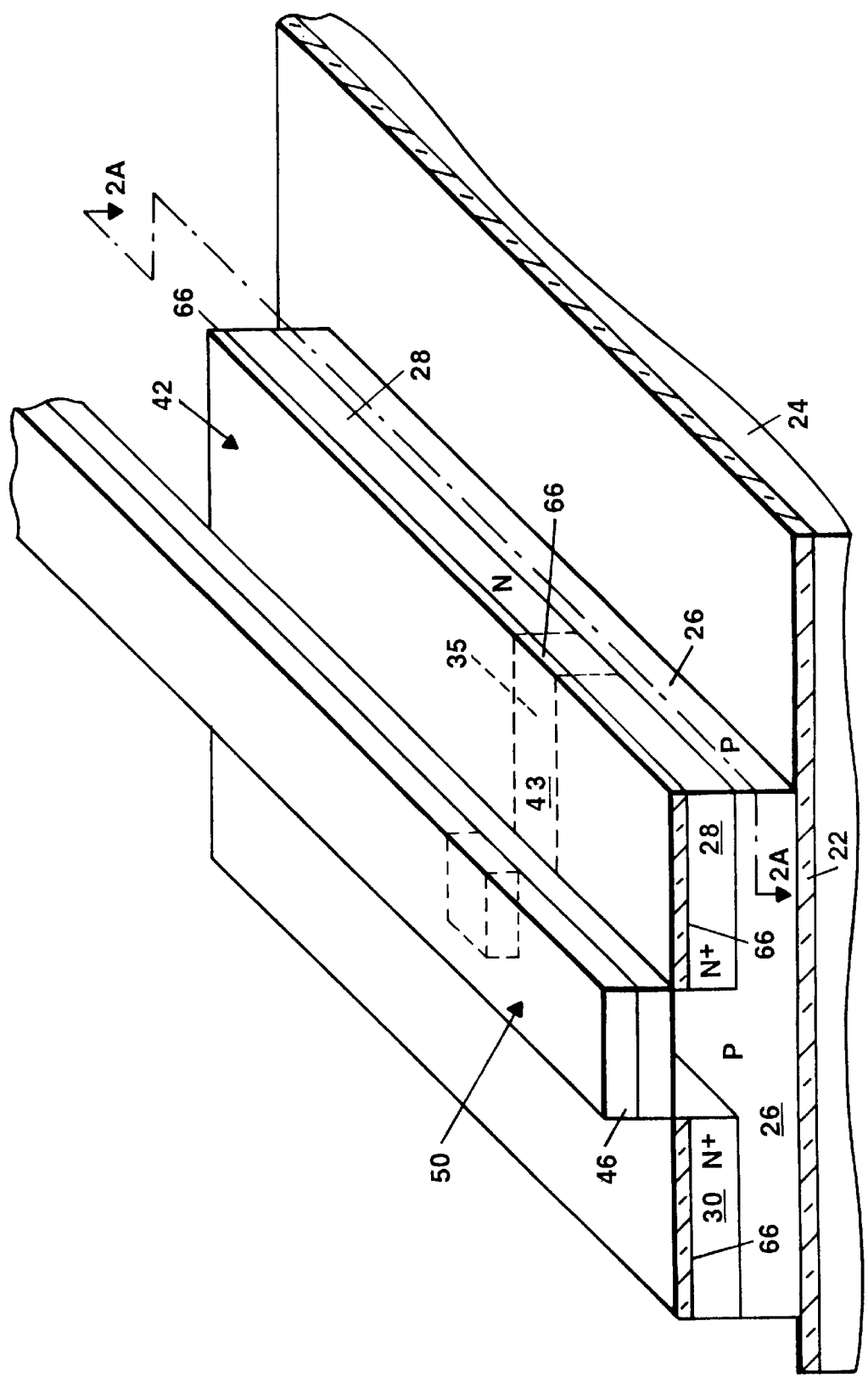

Referring now to FIGS. 4 and 5, the device 20 shown in FIGS. 2, 2A and 3 is formed by masking, with mask 40, N+ implant from a portion of the source area 42 provided in the semiconductor body 26. As a result, silicide cladding in this area 42 is in direct contact with the portion 43 of lightly doped p-type conductivity silicon body 26 forming the Schottky diode SC (FIG. 3) in region 35.

More particularly, as noted above, the silicon body 26 is provided over the electrical insulator 22 in the silicon substrate 24. Next, a electrical insulating layer 44, here silicon dioxide, is formed over the surface of the silicon body 26. A layer 46 of polycrystalline silicon is then formed over the insulating layer 44. Next, the layer 46 of polycrystalline silicon and the underlying portions of the electrical insulating layer 44 are patterned into a gate electrode structure 48 exposing the source and drain areas 42, 50, respectively, as shown in FIG. 4. Thus, source and drain areas 42, 50, respectively, are provided in the semiconductor body 26 on either side of the patterned gate electrode structure 48 using conventional photolithographic-etching techniques.

Figure 4A:
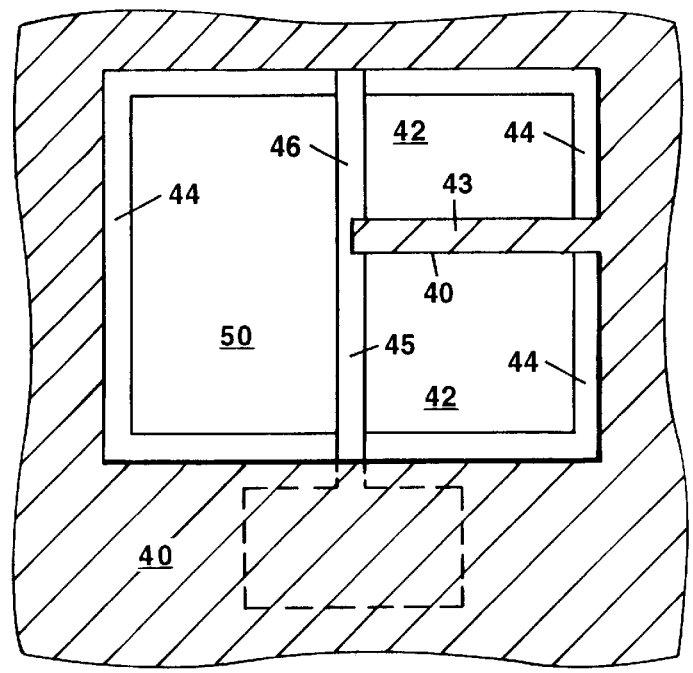

Next, the portion 43 of the source area 42 is masked with the mask 40 along with and a portion 62 of the gate electrode structure 48 contiguous to the masked portion 43 of the source area 42. A plan view is shown in FIG. 4A with the mask 40 being shown with slanted hash marks on its masking surface.

Next, dopant capable of providing N+ type conductivity is implanted into the un-masked portions of the silicon body 26 to the form N+ source and drain regions 28, 30 in the silicon body 26 and into un-masked portions 45 of the gate electrode structure 48. It is noted that the mask 40 blocks such dopant from portion 43 of the silicon body 26 in the contiguous masked portion 62 of the gate electrode structure 48.

Next, the mask 40 is removed, as shown in FIG. 5. The dopant is activated to form the heavily doped, N+ source and drain regions 28, 30. Next, a source and drain metal 66, here a refractory metal, such as titanium or cobalt, is deposited over the source and drain areas 42, 50, respectively, forming silicide regions in the source and drain areas 42, 50. When the metal silicide is also in contact with the lightly doped silicon portion 43 of the silicon body 26, the Schottky barrier contact region 35 is formed (FIG. 2A).

It should be noted that the refractory metal silicide may, alternatively, be formed before, or after, the implantation. That is, referring to FIG. 4, after the layer 46 of polycrystalline silicon and the underlying portions of the electrical insulating layer 42 are patterned into a gate electrode structure 48 with source and drain windows, not shown, in the silicon dioxide layer 44 providing exposure to the source and drain areas 42, 50, respectively, a refractory metal layer, such as titanium or cobalt, is deposited over the surface. Thus, the refractory metal is deposited onto the portions of the silicon 26 exposed by the source and drain areas 42, 50, respectively, onto the polycrystalline silicon on the gate structure, and onto the silicon dioxide. After reacting the refractory metal with the silicon in the source and drain areas 28, 39, the un-reacted refractory metal is etched away (i.e., the metal previously deposited on the silicon dioxide areas is removed). Then, the dopant is implanted using the mask 40, as described above.

Figure 6:
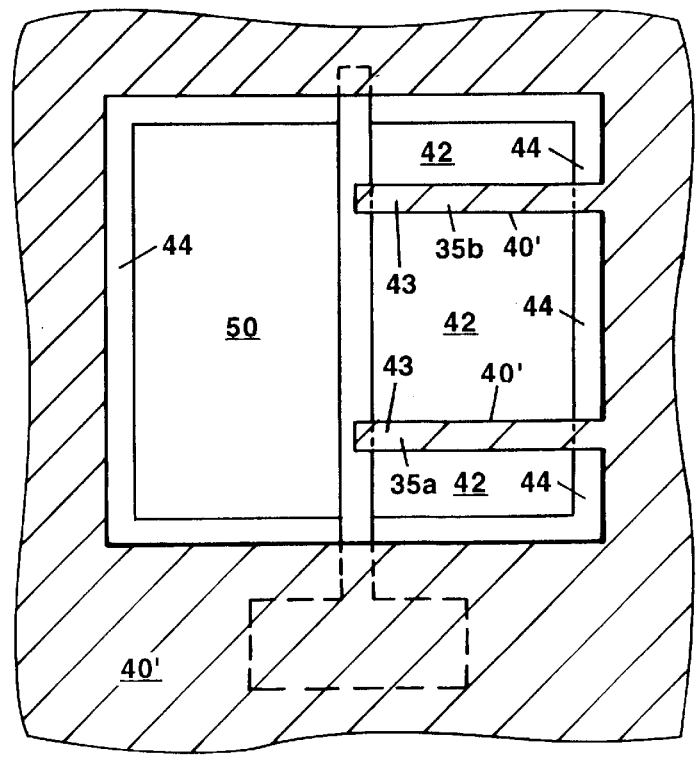
FIG. 6 is a plan view diagrammatical sketch illustrating a mask used in one step of the fabrication of the field effect transistor according to an alternative embodiment of the invention.

FIG. 6 shows another embodiment of the invention for wide MOSFET's. Narrow MOSFET (FIG. 4A) may only require a contact at one end of the gate channel. Wide MOSFET's (FIG. 6) may require Schottky barrier contact regions 35a, 35b contacts at regular intervals, as provided using mask 40' in FIG. 6 under finger-like portion 43 of such mask 40'.

Figure 1B:
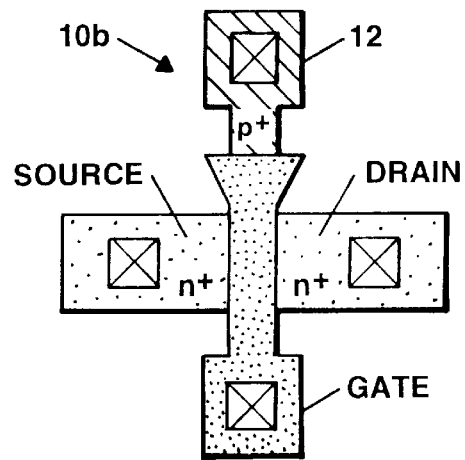
Figure 1C:
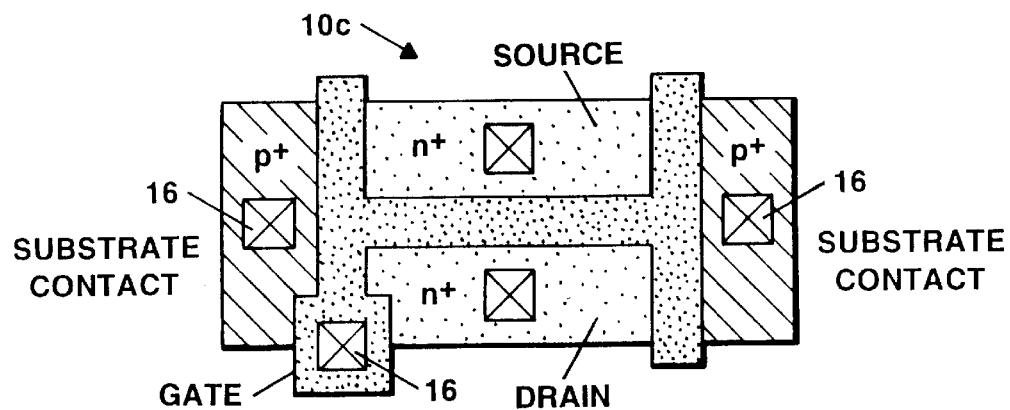
Figure 1D:
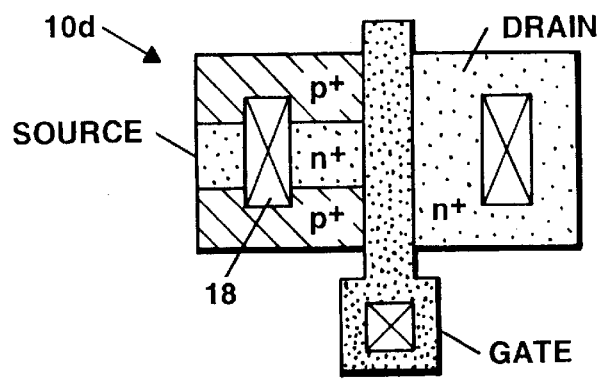
Figure 7:
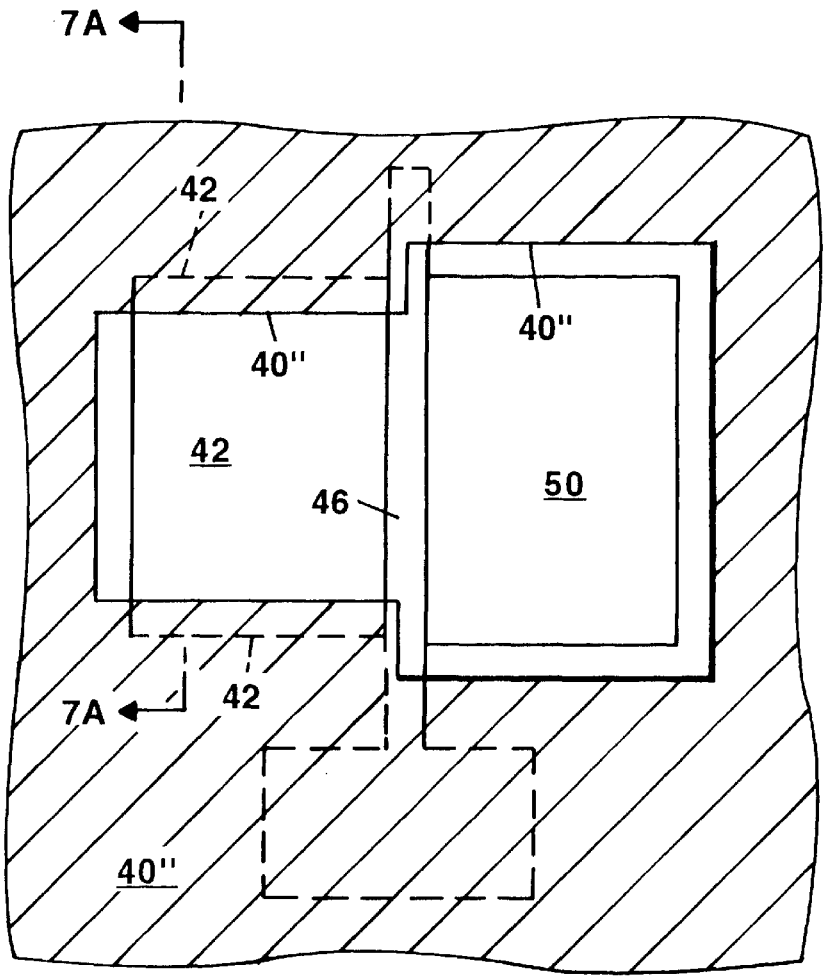
FIG. 7 is a plan view diagrammatical sketch illustrating a mask used in one step of the fabrication of the field effect transistor according to another alternative embodiment of the invention and FIG. 7A is a cross-section elevation diagrammatical sketch of a field effect transistor fabricated using the mask of FIG. 7, such cross-section being taken along line 7A—7A of FIG. 7.
Figure 7A:
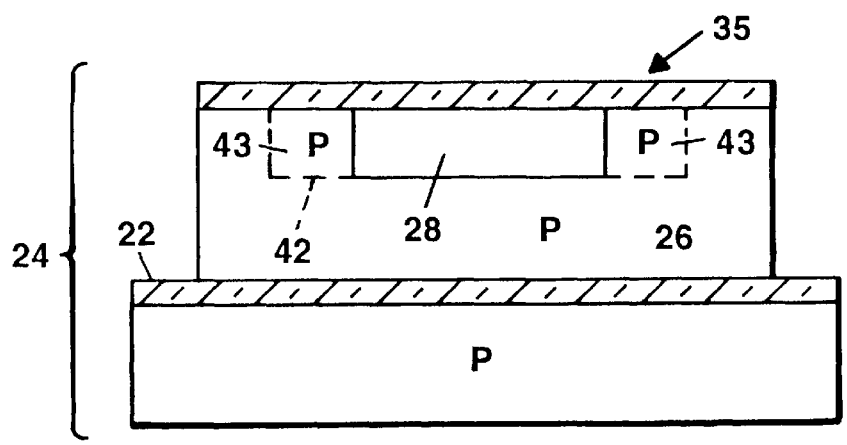

FIG. 7 shows a mask 40' adapted to form the Schottky diodes without any small features in the mask; i.e., the finger-like portion 43 (FIGS. 4A and 6) which extends over the source area 42 and the portion of the gate electrode structure 48. The resulting structure formed using mask 40" is shown in FIG. 7A with region 35 providing the Schottky barrier contact region. In all of the embodiments described in connection with FIGS. 2 through 7, the Schottky diode area (i.e., Schottky barrier contact region 35) is insensitive to implant mask alignment, in contrast to the prior art scheme of FIG. 1D, where the contact area is sensitive to the implant mask alignment.

Figure 8:
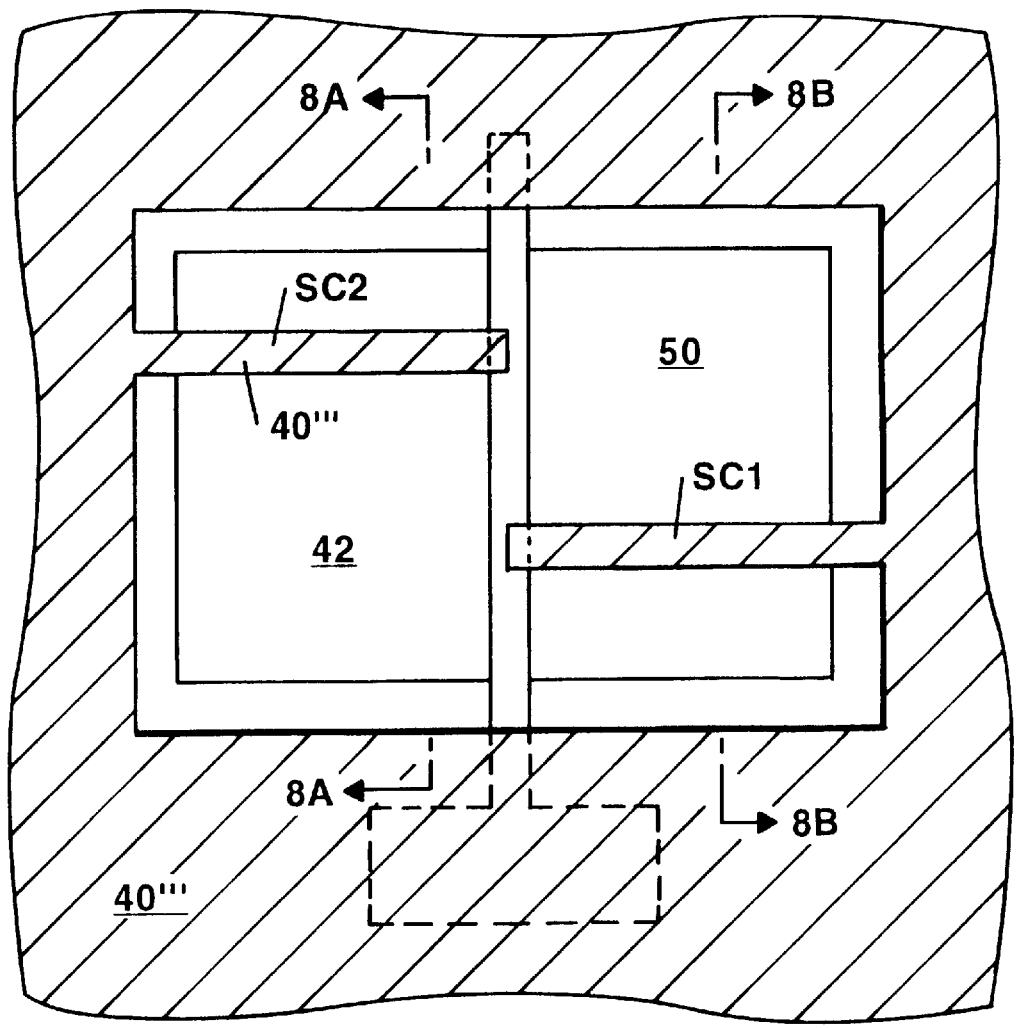
FIG. 8 is a plan view diagrammatical sketch illustrating a mask used in one step of the fabrication of the field effect transistor according to still another alternative embodiment of the invention.
Figure 8A:
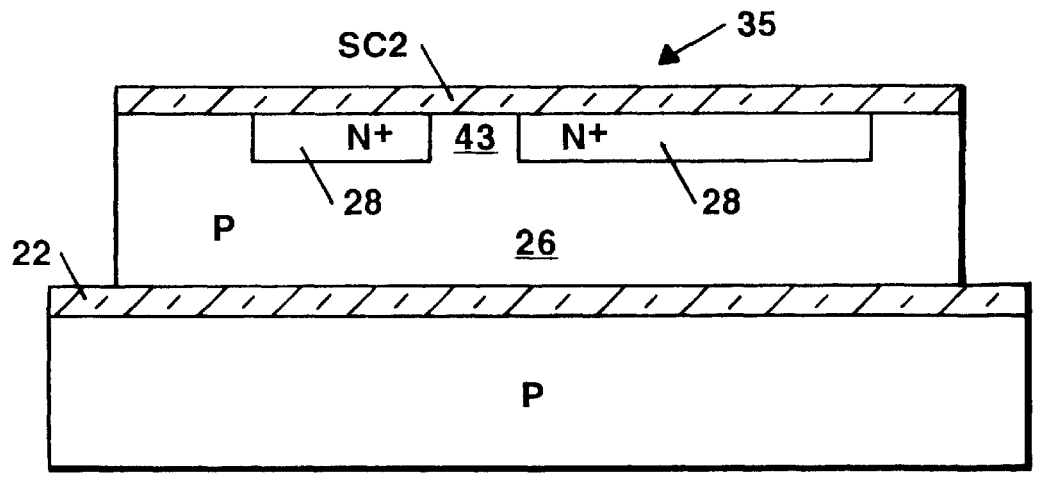
FIGS. 8A and 8B are cross-section elevation diagrammatical sketch of a field effect transistor fabricated using the mask of FIG. 8, such cross-sections being taken along lines 8A—8A and 8B—8B, respectively, of FIG. 8.
Figure 8B:
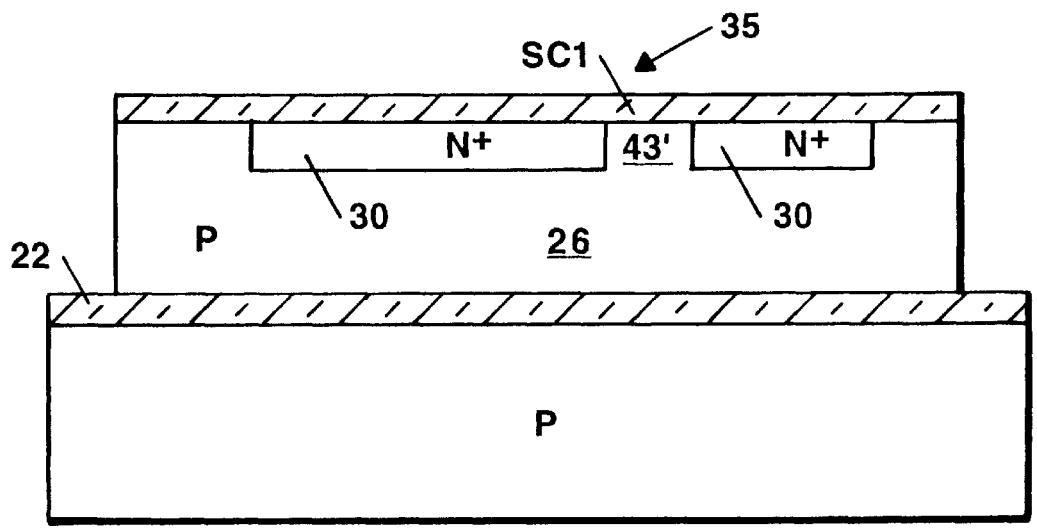
Figure 8C:
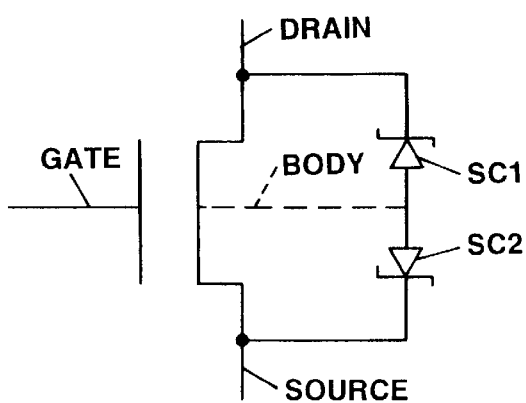
FIG. 8C is aa schematic diagram of the field effect transistor produced with the mask of FIG. 8.

FIG. 8 shows yet another embodiment of the invention using mask 40'" (FIG. 8A). Here Schottky diode SC1 is formed with the anode thereof connected to the body 26 and the cathode thereof connected to the drain. Schottky diode SC2 is formed with its anode connected to the body 26 and its cathode connected to the source. With such an arrangement, source/drain symmetry can be maintained if Schottky diodes SC1, SC2 (FIG. 8C) are formed at both source and drain ends. As long as the reverse biased leakage of the Schottky diode is well controlled, the Schottky diode at the source end serves as a body contact, whereas the one at the drain end is off. When source and drain terminals are swapped, the roles are reversed. However, this penalty in terms of the area required for the same effective width is quite small compared to the prior art scheme of FIGS. 1B and 1C.

Thus, the fabrication sequence required for the invention is identical to that for a standard SOI MOSFET with silicide cladding of the source and drain. Only the design of the N+ implant mask is modified, forming a new device structure. Thus, no process complexity is added to the manufacture of the devices. In all cases, the Schottky diode reduces the total drive current of the MOSFET somewhat, so that the MOSFET width will have to be increased to maintain performance. However, the area penalty is as good as, or smaller than for the prior art schemes.

Figure 9:
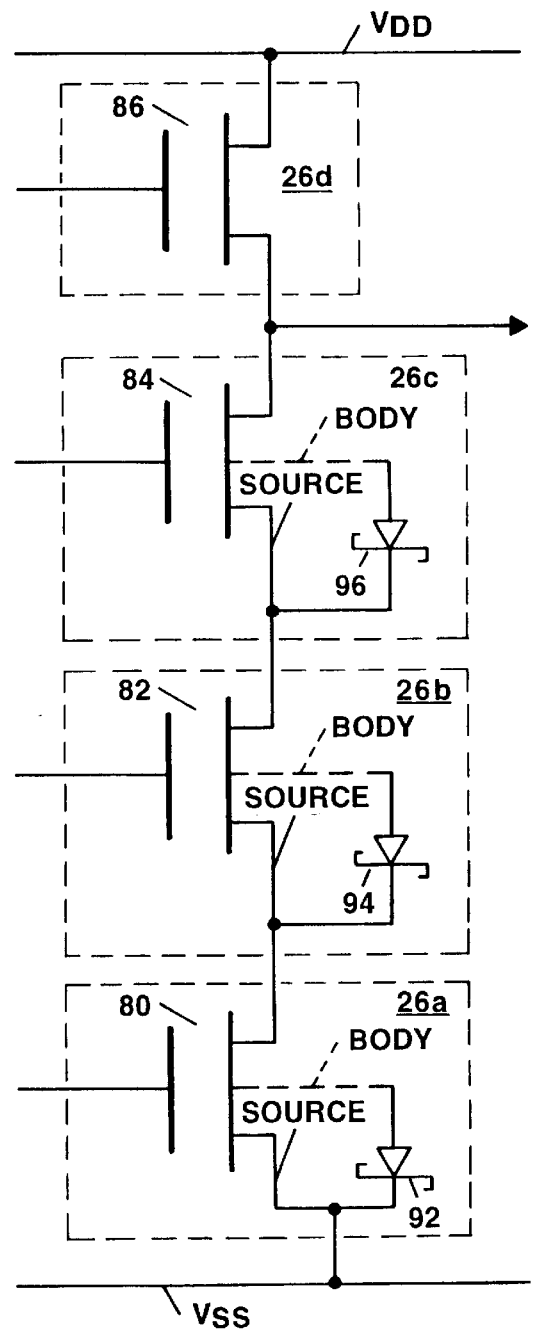
FIG. 9 is a schematic diagram of a circuit which includes field effect transistors according to the invention.

Schottky diodes without leakage are also needed for stacked gates. Consider a stack of NMOS transistors, such as in a NAND gate in FIG. 9. The lowest NMOS transistor 80 has its source at $V_{ss}$; however, the upper NMOS devices can have their sources biased at elevated voltages. In using the present invention, Schottky diode clamps 92, 94 and 96 would be placed at the source of each NMOS device in the stack. If the NMOS devices are in separate silicon islands (i.e., electrically isolated regions of body 26), each NMOS source would have a Schottky contact to the respective isolated body region, and each would have a proper body contact with $V_{bs}$ less than, or equal to 0.3 volts. If all the transistors 80–86 are in the same silicon body 26 island, the Schottky diode at the lower source would bias the body 26, and the upper Schottky diodes would be reversed biased. For the bottom device, $V_{bs}$=0V whereas $V_{bs}$ can be higher for the upper devices. So long as the reverse leakage of the Schottky is small enough, circuit functionality is maintained.

Figure 10:
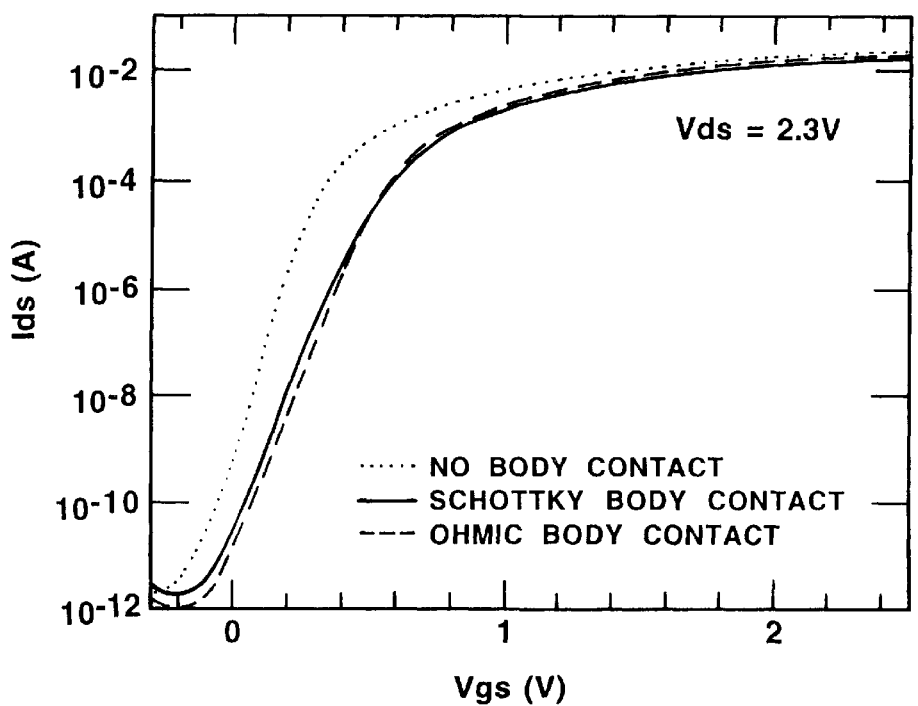
FIG. 10 is a idea plot of source to drain current (Ids) in amps as a function of gate to source voltage (Vgs) in volts for a field effect transistor according to the prior art (i.e., a field effect transistor with "No Body Contact" as in FIG. 1A), a field effect transistor according to the invention (i.e., "Schottky Body Contact"), and a field effect transistor having ohmic body contact (Ohmic Body Contact" as in FIG. 1D)

FIG. 10 shows the DC Id-Vg characteristics of three different type of device structures: "No Body Contact", as in FIG. 1A; "Ohmic Body Contact", as in FIG. 1D; and, the Schottky body contact according to the invention. The "kink" is only observed in the non-body contacted case (FIG. 1A), as both the ohmic and Schottky body contact keep the body potential from rising. Thus, the invention provides the same immunity to the SOI "kink" as the prior art devices in FIGS. 1B–1D.

Figure 11:
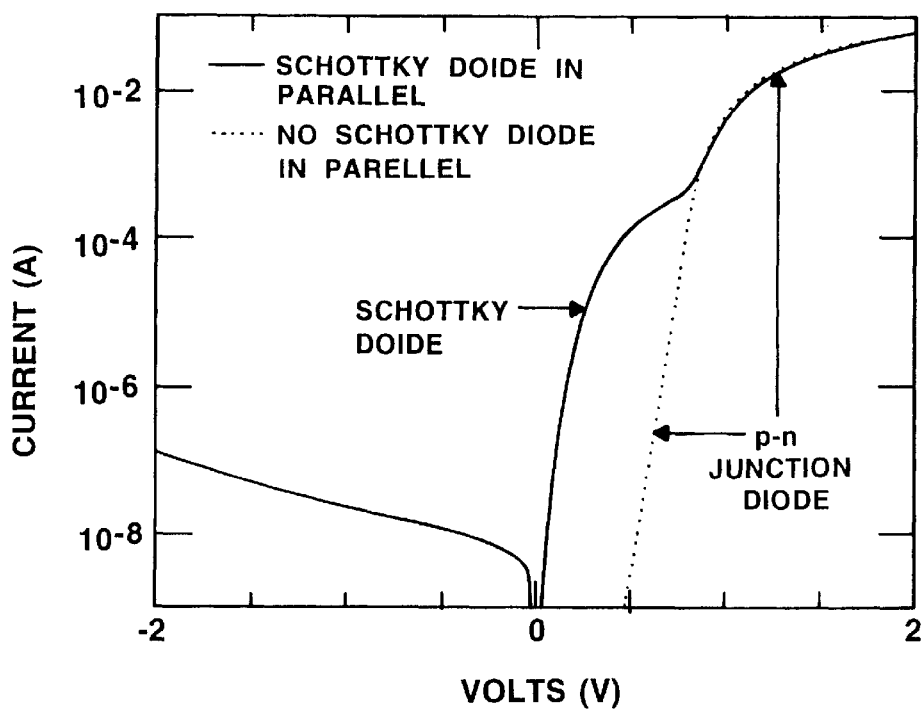
FIG. 11 is a plot of current as a function of voltage for a field effect transistor according to the invention ("Schottky Diode in Parallel" and a field effect transistor according to the PRIOR ART ("No Schottky Diode in Parallel").

FIG. 11 shows the source to body I–V characteristics for NMOS, comparing a source junction with a Schottky diode to one without. The shoulder with the 0.3 V threshold is confirmation that the Schottky diode is present. The reverse bias leakage is somewhat large, but should be adequate for most applications. In this structure, over-etching of the silicide during contact etch may have enhanced the reverse bias leakage. Additionally, the technique of counter-doping a thin surface layer to increase barrier height (and thereby reduce leakage) is well known in the art, should the leakage be a problem (See "Metal-Semiconductor Contacts", by E. H. Rhoderick, published by Clarendon Press (1978) at pages 176–178 and "Control of Schottky Barrier Height Using Highly Doped Surface Layers", by J. M. Shannon, published in Solid State Electronics, vol. 19 pages 537–543 , 1976. This could be accomplished by placing the threshold voltage implant in the Schottky regions.

Other embodiments are within the spirit and scope of the appended claims. For example, while an n-MOSFET has been described the principles apply to p-MOSFETs.

What is claimed is:

1. A method for forming a semiconductor structure, comprising the steps of:

providing a semiconductor body over an electrical insulator;

providing source and drain areas in the semiconductor body on either side of a gate channel;

introducing dopant into un-masked portions of the source and drain areas to form source and drain regions in the semiconductor body, such mask blocking such dopant from passing into the masked portion of at least one of the source and drain areas and the contiguous portion of the semiconductor body; and depositing a metal between at least one of the source and drain regions and the contiguous portion of the semiconductor body to provide a Schottky diode between at least one of the source and drain regions and the contiguous portion of the semiconductor body.

2. The method recited in claim 1 wherein the metal depositing step is performed prior to the dopant introduction step.

3. The method recited in claim 1 wherein the metal depositing step is performed subsequent to the dopant introduction step.

4. The method for forming a semiconductor structure recited in claim 1 including forming a plurality of Schottky contact regions disposed along a width of one of the source and drain regions.

5. The method for forming a semiconductor structure recited in claim 2 wherein the Schottky contact regions are disposed at a periphery of one of the source and drain regions.

6. The method for forming a semiconductor structure recited in claim 1 including forming a plurality of Schottky contact regions, a first one of such contact regions providing a Schottky diode between the semiconductor body and the source region and a second one of such contact regions providing a Schottky diode between the semiconductor body and the drain region, the first and second contact regions being at different locations along a width of the source and drain regions.

7. A method of making a semiconductor device, the method comprising:

providing a semiconductor region of a first conductivity type;

forming a conductive gate over a channel region of the semiconductor region, the conductive gate being insulated from the channel region;

masking a second region of the of the semiconductor region, the second region being adjacent the channel region;

doping source and drain regions of the semiconductor region with impurities of a second conductivity type opposite the first conductivity type, the source region being separated from the drain region by the channel region; and forming a metal layer over second region and at least one of the source and drain regions, the metal layer abutting the second region;

wherein the second region and the channel region have substantially the same doping concentration.

8. The method of claim 7 wherein the semiconductor region is provided over an insulating layer.

9. The method of claim 8 wherein the insulating layer is disposed over a semiconductor substrate.

10. The method of claim 7 wherein the metal layer comprises a refractory metal layer.

11. The method of claim 7 wherein the metal layer and underlying portions of the semiconductor region are reacted to form silicide regions.

12. The method of claim 7 wherein masking a second region of the semiconductor region comprises masking a plurality of regions.

13. The method of claim 12 wherein a first of the plurality regions is located adjacent the source region and a second of the plurality of regions is located adjacent the drain region.

14. A method of forming a field effect transistor structure, the method comprising:

providing a first type conductivity semiconductor body disposed on an insulator;

forming a source region in the semiconductor body;

forming a drain region in the semiconductor body, the source and drain regions being of a conductivity type opposite the conductivity type of the semiconductor body;

forming a gate electrode adapted to control a flow of carriers in a channel through the semiconductor body between the source and drain regions; and forming a Schottky contact region providing a Schottky diode between the semiconductor body and at least one of the source and drain regions.

15. The method of claim 14 wherein the step of forming a Schottky contact region comprises forming a plurality of Schottky contact regions disposed along a width of one of the source and drain regions and extending from the approximate edge of the gate electrode to the approximate edge of the semiconductor body.

16. The method of claim 15 wherein the step of forming a Schottky contact region comprises forming a Schottky contact region at a periphery of one of the source and drain regions.

17. The method of claim 15 wherein the step of forming a Schottky contact region comprises forming a plurality of Schottky contact regions, a first one of the contract regions providing a Schottky diode between the semiconductor body and the source region and a second one of the contact regions providing a Schottky diode between the semiconductor body and the drain region, the first and second contact regions being at different locations along a width of the source and drain regions.

* * * * *